United States Patent [19]

Takata

[11] Patent Number: 4,589,048
[45] Date of Patent: May 13, 1986

[54] APPARATUS FOR DETECTING GROUND FAULT IN VARIABLE-VOLTAGE VARIABLE-FREQUENCY POWER SYSTEM

[75] Inventor: Nobuharu Takata, Hyogo, Japan

[73] Assignee: Mitsubishi Denki Kabushiki Kaisha, Tokyo, Japan

[21] Appl. No.: 571,656

[22] Filed: Jan. 17, 1984

[30] Foreign Application Priority Data

| Mar. 23, 1983 | [JP] | Japan | 58-49737 |
| Mar. 23, 1983 | [JP] | Japan | 58-49738 |
| Mar. 23, 1983 | [JP] | Japan | 58-49739 |
| Mar. 23, 1983 | [JP] | Japan | 58-43218 |

[51] Int. Cl.$^4$ .............................................. H02H 3/16
[52] U.S. Cl. ........................................ 361/42; 361/47; 361/20; 361/86
[58] Field of Search .................. 361/47, 48, 49, 50, 361/42, 76, 86, 113, 21, 20, 1

[56] References Cited

U.S. PATENT DOCUMENTS

| 2,342,800 | 2/1944 | Griscom | 361/47 |
| 2,836,771 | 5/1958 | Jessee | 361/76 |
| 4,429,338 | 1/1984 | Becker et al. | 361/113 X |

FOREIGN PATENT DOCUMENTS 2077532 12/1981 United Kingdom ............... 361/76

Primary Examiner—Harry E. Moose, Jr.
Attorney, Agent, or Firm—Bernard, Rothwell & Brown

[57] ABSTRACT

An apparatus for detecting a ground fault occurring in a power system which furnishes an AC power from a variable-voltage variable-frequency power supply to a load via a voltage transformer. The apparatus compares a zero phase sequence current with a reference value and, upon detection of occurrence of a ground fault, produces an output signal representing the ground fault. Prior to such comparison, the zero phase sequence current is so processed as to be independent of the frequency of the power system or the reference value is so processed as to be dependent on the said frequency.

4 Claims, 8 Drawing Figures

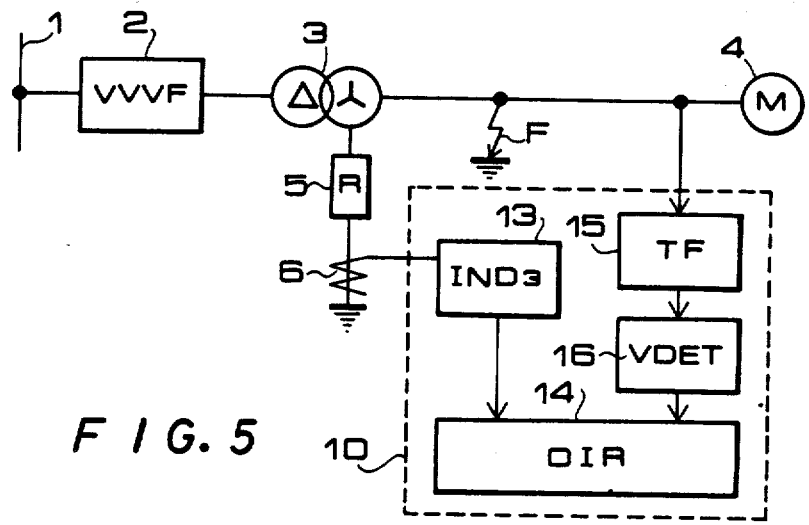
F I G. 5
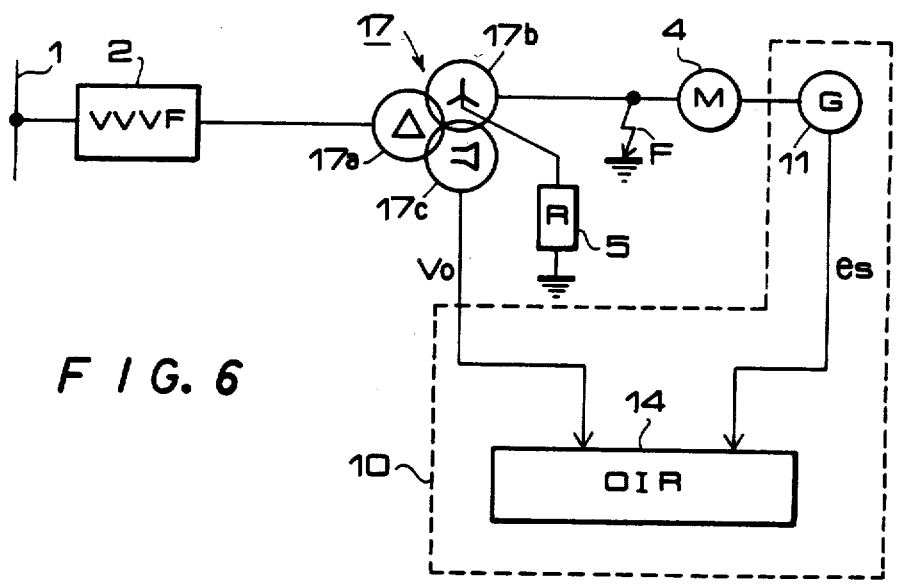
F I G. 6

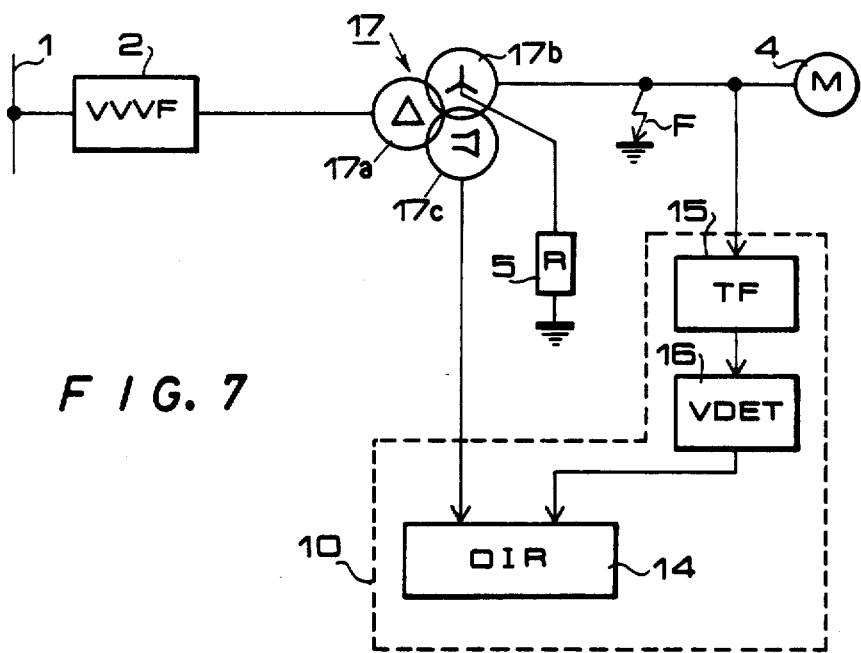
F I G. 7
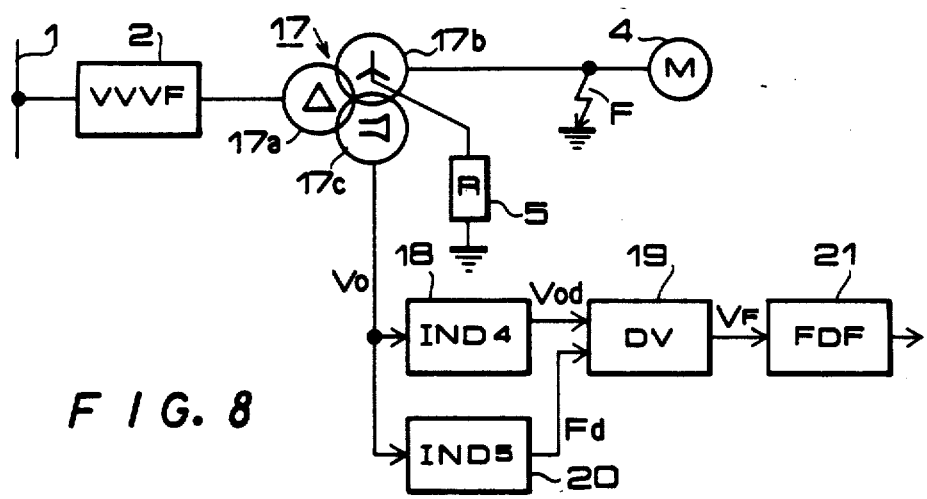
F I G. 8

APPARATUS FOR DETECTING GROUND FAULT IN VARIABLE-VOLTAGE VARIABLE-FREQUENCY POWER SYSTEM

FIELD OF THE INVENTION

The present invention relates to an apparatus for detecting a ground fault occurring in a variable-voltage variable-frequency power system the system voltage of which is controlled in such manner as to be nearly proportional to its frequency in order not to saturate magnetically the winding of a motor connected to the power system.

In the prior ground fault detecting apparatus known heretofore, when its sensitivity is so preset as to detect an incomplete ground fault of, e.g. 40% at a commercial frequency, there has been existent a disadvantage that, in case the frequency is below 40% of a normal value at the occurrence of a ground fault, such a fault is undetectable even if it is a complete one since the zero phase sequence current is also reduced below 40%, because the system voltage becomes below 40% in accordance with the decrease in frequency.

FIG. 1 shows a connection diagram of a conventional detecting apparatus, wherein the voltage of an AC power system is applied to an AC motor, i.e. a load 4 via a variable-voltage variable-frequency power supply 2 and an output transformer 3. Since the Y-connected secondary neutral point of the transformer 3 is grounded via a resistor 5, the zero phase sequence current flowing therethrough is transformed by means of a current transformer 6 to a voltage signal, which is then introduced to an overcurrent detector 7 which serves also as a protective relay.

The motor 4 rotates at a speed corresponding to the frequency of the input power supplied thereto. In order to prevent overheating that may be caused during a low-frequency operation, the output of the power supply 2 is so controlled that the following relationship is maintained between the voltage E and the frequency f of the power system.

$$E = K_o \cdot f \tag{1}$$

where $K_o$ is a constant.

Supposing now that a ground fault F occurs in the line connecting the transformer 3 and the motor 4 with each other, a zero phase sequence circuit comes to be formed and thereby induces flow of a zero phase sequence current Io therethrough. Consequently, a current 3Io represented by the following equation is introduced to the detector 7.

$$3Io = E/Rn = V_s \cdot f/Rn \tag{2}$$

where Rn is a constant proportional to the resistance value of the resistor 5, and Vs is a normal operating voltage in the power system at the commercial frequency fs.

When the current 3Io increases beyond a predetermined value, the detector 7 should properly execute its protective operation. However, since the current 3Io, being an input to the detector 7, is a function of the frequency f of the power system as expressed by Eq. (2), the detector 7 fails to respond to the occurrence of a one-phase ground fault F when the system operating in a lowered frequency.

With incomplete ground faults also taken into consideration, the detector 7 is selectively set in such a manner as to respond to a range of 20 to 50% of a reference value which is determined on the basis of the zero phase sequence current 3Io of a one-phase complete ground fault where the frequency f is equal to the commercial frequency fs and the voltage E is equal to the normal operating voltage Vs. For example, in case a relay pickup value of 40% is selected, if the frequency f is less than 40% × fs, the zero phase sequence current becomes less than 40% of the reference value, in accordance with the equation (2), even though the ground fault is a complete one, so that the detector 7 fails to respond thereto and permits such a one-phase ground fault to be undetected.

OBJECTS OF THE INVENTION

An object of this invention is to provide an improved ground fault detecting apparatus which is adapted for use and properly responsive to any one-phase ground fault in a variable-voltage variable-frequency power system, the system voltage of which is controlled in such manner as to be nearly proportional to its frequency.

And another object of this invention is to provide an improved ground fault detecting apparatus which performs a high-reliability responsive operation in a variable-voltage variable-frequency power system.

SUMMARY OF THE INVENTION

Thus, in accordance with the present invention there is provided an apparatus for detecting a ground fault occurring in a power system which furnishes an AC power from a variable-voltage variable-frequency power supply to a load via a transformer. The system voltage of the power system is so controlled as to be nearly proportional to its frequency. The apparatus provides an output to indicate the occurrence of such a ground fault in the system when the modified level of the zero phase sequence current in the power system is judged to be higher than a reference signal level preset for ground fault detection.

The zero phase sequence current is modified in the apparatus of the present invention as to be inversely proportional to the output frequency of the variable-voltage variable-frequency power source. The zero phase sequence current in the power system is proportional to its frequency, and the zero phase sequence current is changed into a new, modified level inversely proportional to the frequency of the power source. Therefore, even though the frequency of the system is being lowered, the modified level introduced to relay means is the same as the value of commercial frequency.

The ground fault detecting apparatus according to the present invention may be so formed as to execute its protective operation when the ratio between the voltage value obtained from the zero phase sequence current and the operating frequency in the system has exceeded a predetermined value.

BRIEF DESCRIPTION OF THE DRAWINGS

FIG. 5 is a block diagram of a third embodiment of the invention;

FIG. 6 is a block diagram of a fourth embodiment of the invention;

FIG. 7 is a block diagram of a fifth embodiment of the invention; and

FIG. 8 is a block diagram of a sixth embodiment of the invention.

DETAILED DESCRIPTION OF THE PREFERRED EMBODIMENTS

Figure 2:
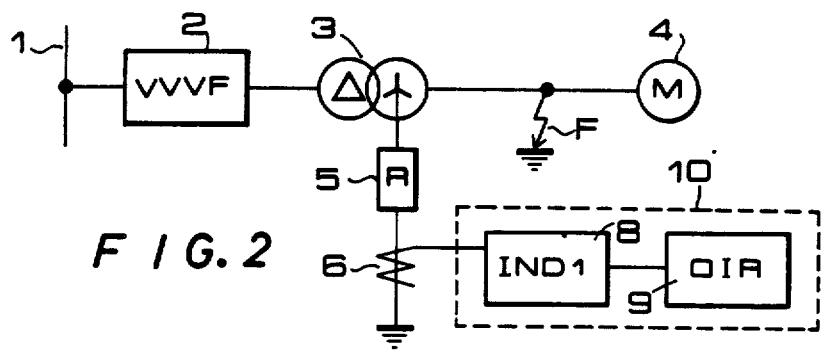
FIG. 2 is a block diagram of a first embodiment of the present invention.

In FIG. 2 showing the block diagram of a first exemplary embodiment of the ground fault detecting apparatus according to the present invention, the voltage of a power system 1 is applied via the power supply 2 and the transformer 3 to the load 4, and the zero phase sequence current flowing through the secondary neutral point of the tarnsformer 3 via the resistor 5 is transformed to the voltage signal by means of a current transformer 6, as mentioned previously. The current from the transformer 6 is introduced to an input unit (IND1) 8, whose output having a value of 3Io/f is then fed to an overcurrent relay (OIR) 9. The input unit (IND1) 8 is a modifying means, and its output signal is proportional to its input 3Io and inversely proportional to the system frequency f. Referring to the equation (2), the output signal of the input unit (IND1) 8 is equal to $3Io/f = Vs/Rn$, which is the same as the value of the commercial frequency, even though the frequency is being lowered. The input unit 8 and the relay 9 constitute a detector 10 as shown enclosed with a dotted line.

Figure 3:
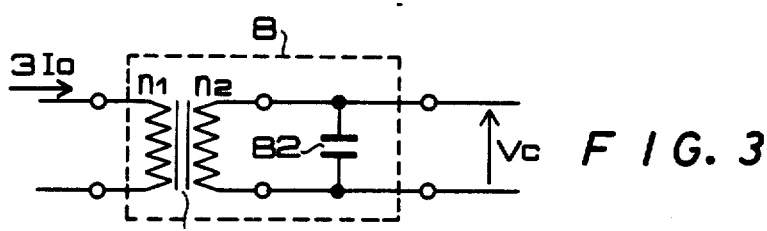
FIG. 3 is a circuit diagram of an input unit shown in FIG. 2.

FIG. 3 is an example of a circuit diagram showing the detail of the input unit 8, wherein the current 3Io fed from the current transformer 6 is introduced to the primary side of a current transformer 81 having a primary winding n1 and a secondary winding n2. The two ends of the secondary winding are connected to the relay 9, and a capacitor 82 is connected therebetween.

According to such a circuit configuration, a current $3Io \times n2/n1$ flows through the secondary winding of the current transformer 81, so that a voltage Vc is produced between the terminals of the capacitor 82.

$$Vc = 3Io \times Kc/f \quad (3)$$

where $$Kc = n1/n2 \cdot \tfrac{1}{2}\pi c \quad (4)$$

From Eq. (2), Eq. (3) can be expressed as $$Vc = (Vs)/(Rn) \times f \times (Kc)/(f) = Vs \times Kc/Rn \quad (5)$$

As is obvious from Eq. (5), the voltage Vc is the same as the value in case of commercial frequency, even though the frequency f of the power system is being lowered. It is obvious that the duty of the capacitor 82 is not a filter for suppressing harmonics but a dividing operator by frequency f. Since the voltage Vc is applied as an input to the relay 9, in case a ground fault F occurs as illustrated, a signal representative of such a fault is produced with the detection sensitivity independent of the operating frequency, that is regardless of whether the system at the time is in a normal operating state or a low-frequency one.

Figure 4:
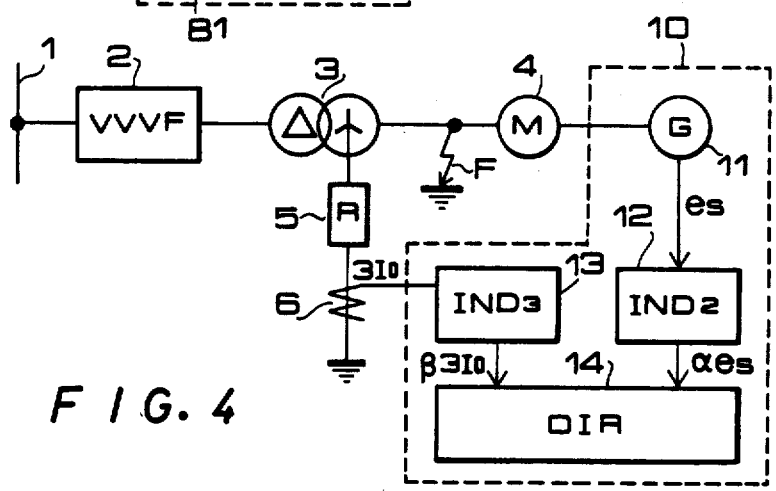
FIG. 4 is a block diagram of a second embodiment of the invention.

FIG. 4 is a block diagram showing a second exemplary embodiment of the detecting apparatus according to this invention, wherein a pilot generator (G) 11 is axially connected to a motor 4 and produces an output voltage $e_s$, which is applied to an input unit (IND2) 12 of a detector 10. The detector 10 further includes an input unit (IND3) 13 connected to a current transformer 6 to multiply its output 3Io by $\beta$ and an overcurrent relay (OIR) 14 which receives both the multiplied output $\alpha e_s$ of the input unit 12 and the output $\beta 3Io$ of the input unit 13 where $\alpha$ and $\beta$ are constants. The relay 14 provides a detection signal representative of a ground fault when the output $\beta 3Io$ of the input unit 13 has exceeded the set value determined by the output $\alpha e_s$ of the input unit 12.

Figure 1:
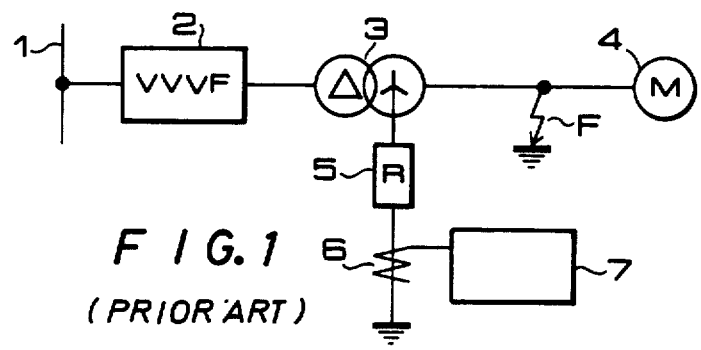
FIG. 1 is a connection diagram of a conventional detecting apparatus relative to a power system.

According to such a circuit configuration, the voltage $e_s$ obtained from the generator 11 has a value proportional to the driving power frequency f of the motor 4, and the set value for the relay 14 is represented by $\alpha \times kf$ (where k is a constant) varying in conformity with the frequency f. In case a ground fault F occurs as illustrated, since the reference value obtained from the output voltage $\alpha e_s$ is changed in proportion to the system frequency f, the relationship of $\beta \cdot 3Io > \alpha \cdot e_s$ is judged properly, even though the output $\beta \cdot 3Io$ of the input unit B is changed in proportion to the system frequency so that the relay 14 is able to produce a signal representing the ground fault properly. In other words, the second exemplary embodiment illustrated in FIG. 4 shows that the reference value of the relay proportional to the system frequency is used instead of the modifying means (IND) 8 illustrated in FIG. 1.

In the arangement where the motor 4 employed is of induction type, there generally exists slipping of 5% or so in its rotation. Consequently, the output $e_s$ of the generator 10 is somewhat deteriorated in the proportional relation to the driving power frequency of the motor 4. However, the detection error resulting therefrom is considered to be practically negligible.

FIG. 5 is a block diagram showing a third exemplary embodiment of the detecting apparatus according to this invention, wherein the voltage at the input terminal of the motor 4 is introduced to a voltage detector 16 via a transformer 15. And the detector 16 converts the input voltage to an adequate level, which is then fed as a reference signal, i.e. a set signal to a relay 14. The set signal has a value equal to the voltage applied to the motor 4. Since V$\Delta$ (phase to phase voltage) is not changed in case of one-phase ground fault of high resistance power system, the voltage introduced to transformer (TF) 15 is one of the phase to phase voltages at the input terminals of motor 4, which is proportional to the system frequency. Other circuit stages are the same as those in the foregoing embodiment shown in FIG. 4. In short, FIG. 5 is an example wherein the system voltage proportional to its frequency is applied as the reference value of the relay instead of the output voltage obtained from pilot generator (G) 11 illustrated in FIG. 4.

FIG. 6 is a block diagram showing a fourth exemplary embodiment of the detecting apparatus according to this invention, wherein the output voltage of a power supply 2 is applied to a delta-connected primary winding 17a of a voltage transformer 17. The transformer 17 further has a Y-connected secondary winding 17b for applying its output voltage to the aforementioned load 4 with the neutral point thereof grounded through the resistor 5 and an open delta-connected tertiary winding 17c for applying the zero phase voltage Vo to the relay 14. The load 4 is connected to the aforementioned generator 11, which then applies the voltage $e_s$ to the relay 14. When the condition of $Vo > e_s$ is detected subsequently to occurrence of a ground fault F as illustrated, the relay 14 produces a signal representing such a fault. In other words, FIG. 6 shows an example in which a zero phase sequence voltage is applied as the comparison input signal to relay (OIR) 14 instead of the zero phase sequence current illustrated in FIG. 4, wherein the zero phase sequence voltage is proportional to the zero phase sequence current as represented.

FIG. 7 is a block diagram showing a fifth exemplary embodiment of the detecting apparatus according to this invention. In comparison with the foregoing embodiment shown in FIG. 5, the setting input to the relay 14 is the same as in the example of FIG. 5, while the comparison input thereto is obtained from the tertiary winding 17c of the transformer 17. And when the voltage from the winding 17c has exceeded the output voltage of the detector 16, the relay 14 produces a signal representing the ground fault.

FIG. 8 is a block diagram showing a sixth exemplary embodiment of the detecting apparatus according to this invention, wherein an input unit (IND4) 18 receives a zero phase voltage Vo from the tertiary winding 17c of a voltage transformer 17 and converts the input voltage to a digital voltage signal Vod, which is subsequently fed to a first input terminal of a divider 19. The signal Vod is expressed as follows.

$$Vod = f \cdot Vs/fs \cdot Kod$$

where f is the power supply frequency to the motor 4; fs is a commercial frequency; Vs is a normal operating voltage in the power system at the commercial frequency fs; and Kod is a constant.

The voltage Vo is introduced also to an input unit (IND5) 20 and is converted to a digital value posterior to multiplication of the frequency f, which is detected from the voltage Vo, by a constant Kfd as shown in the following equation. The signal Fd thus obtained is fed to the second input terminal of the divider 19.

$$Fd = f \cdot Kfd \quad (6)$$

The divider 19 executes the following division on the basis of the first input signal Vod and the second input signal Fd, thereby providing a voltage-to-frequency ratio $V_F$.

$$V_F = Vod/Fd = (Kod/Kfd) \cdot (Vs/fs) = KD \cdot Vs \quad (7)$$

where $Kd = Kod/Kfd \cdot fs$

A ground fault discriminator (FDF) 21 receives the ratio $V_F$ from the divider 19 and compares the same with the fault detection reference value Vref, which is constant. And if the former is greater than the latter, the discriminator 21 produces a ground fault detection signal. In this case, due to the fact that the ratio $V_F$ is not affected at the time of the ground fault by the system frequency as represented in Eq. (7), the discrimination accuracy is not deteriorated even though the frequency at the fault time is lowered and the zero phase voltage Vo is small.

Although the zero phase voltage is acquired from the open tertiary winding 17c of the transformer 3 in the exemplary embodiments mentioned above, the circuit configuration may be so modified as to obtain it from the two terminals of the resistor 5. Furthermore, the input units 18, 20 and the divider 19 may be of analog type as well.

What is claimed is:

1. An apparatus for detecting a ground fault in a power system which is fed with a variable-voltage, variable-frequency power source controlled in such manner that the output voltage of said power source is nearly proportional to its output frequency, said apparatus comprising:
    input means for producing a signal proportional to a zero phase sequence voltage or current of said power system;
    modifying means for obtaining an operation signal inversely proportional to the frequency of said power system from the signal of said input means; and
    relay means activated when the signal of said modifying means is beyond a predetermined level.

2. The ground fault detecting apparatus as defined in claim 1, wherein said modifying means comprises zero phase sequence current transformer and a capacitor connected across the terminals of the secondary winding of said current transformer, the voltage on said capacitor being introduced to said relay means.

3. An apparatus for detecting a ground fault in a power system which is fed with a variable-voltage, variable-frequency power source controlled in such manner that the output voltage of said power source is nearly proportional to its output frequency, said apparatus comprising:
    first input means for producing an operation signal proportional to a zero phase sequence voltage or current of said power system;
    second input means for producing a reference signal proportional to the frequency of said power system; and
    relay means activated when the output signal of said first input means is beyond the reference signal of said second input means.

4. The ground fault detecting apparatus as defined in claim 3, wherein said second input means comprises a pilot generator connected to said motor, and said reference signal is obtained from the output voltage of said pilot generator.

* * * * *